United States Patent
Sasaki

[19]

[11] Patent Number: 6,064,118
[45] Date of Patent: *May 16, 2000

[54] MULTILEVEL INTERCONNECTION STRUCTURE HAVING AN AIR GAP BETWEEN INTERCONNECTS

[75] Inventor: Makoto Sasaki, Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/061,903

[22] Filed: Apr. 17, 1998

[30] Foreign Application Priority Data

Apr. 18, 1997 [JP] Japan .................................... 9-101308

[51] Int. Cl.[7] ..................... H01L 23/485; H01L 23/532
[52] U.S. Cl. ............................................ 257/758; 257/750
[58] Field of Search ................................... 257/750, 758, 257/773, 522

[56] References Cited

U.S. PATENT DOCUMENTS

| | | | |
|---|---|---|---|
| 5,034,799 | 7/1991 | Tomita et al. | 357/71 |
| 5,117,276 | 5/1992 | Thomas et al. | 357/71 |
| 5,171,713 | 12/1992 | Matthews | 437/189 |
| 5,391,921 | 2/1995 | Kudoh et al. | 257/758 |
| 5,401,687 | 3/1995 | Cole et al. | |
| 5,407,860 | 4/1995 | Stoltz et al. | |
| 5,413,962 | 5/1995 | Lur et al. | 437/195 |
| 5,548,099 | 8/1996 | Cole, Jr. et al. | 219/121.69 |
| 5,668,398 | 9/1997 | Havemann et al. | 257/522 |
| 5,670,790 | 9/1997 | Katoh et al. | 257/14 |
| 5,703,404 | 12/1997 | Matsuura | 257/758 |
| 5,757,072 | 5/1998 | Gorowitz et al. | 257/700 |
| 5,759,906 | 6/1998 | Lou | 438/623 |
| 5,798,559 | 8/1998 | Bothra et al. | 257/522 |
| 5,856,754 | 1/1999 | Yamashita | 327/407 |

FOREIGN PATENT DOCUMENTS

| | | |
|---|---|---|
| 0 373 360 | 6/1990 | European Pat. Off. . |
| 0 373 360 A2 | 6/1990 | European Pat. Off. ............... 257/522 |
| 61-107746 | 5/1986 | Japan . |
| 3-204960 | 9/1991 | Japan ..................... 257/522 |
| 4-207055 | 7/1992 | Japan . |
| 5-326729 | 12/1993 | Japan . |
| 7-45701 | 2/1995 | Japan . |
| 7-245301 | 9/1995 | Japan . |
| 7-326670 | 12/1995 | Japan . |

OTHER PUBLICATIONS

M.B. Anand, M. Yamada and H. Shibata, "Nura: A Feasible, Gas–Dielectric Interconnect Process", Symposium on VLSI Technology Digest of Technical Papers, Jun. 11, 1996, pp. 82 and 83 XP 000639294.

Anand et al., "Nura: A Feasible, Gas–Dielectric Interconnect Process," Symposium on VLSI Technology Digest of Technical Papers, Jun. 11, 1996, pp. 82 and 83 XP 000639294.

Wolf, Silicon Processing for the VLSI Era: Vol. 2 — Process Integration, pp. 273–275, 1990.

*Primary Examiner*—Jerome Jackson, Jr.
*Assistant Examiner*—Bradley William Baumeister
*Attorney, Agent, or Firm*—Sughrue, Mion, Zinn, Macpeak & Seas, PLLC

[57] ABSTRACT

A semiconductor device has an air-gap/multi-level interconnection structure. The interconnects are insulated from one another by an air gap in the same layer, and by an interlevel dielectric film between layers and from a semiconductor substrate. A high-speed semiconductor device is obtained due to a lower parasitic capacitance.

16 Claims, 13 Drawing Sheets

MULTILEVEL INTERCONNECTION STRUCTURE HAVING AN AIR GAP BETWEEN INTERCONNECTS

BACKGROUND OF THE INVENTION (a) Field of the Invention

The present invention relates to a multilevel interconnection structure in a semiconductor device and, more particularly, to a multilevel interconnection structure having an air gap for insulating interconnects in the same layer. The present invention also relates to a method for manufacturing such a multilevel interconnection structure.

(b) Description of the Related Art

With the advance of finer pattern and higher operational speed of transistor elements in a semiconductor device, the line width and the line space in the interconnect pattern have been reduced remarkably. The reduction of the thickness of the semiconductor device, however, is not noticed partly because such a reduction is limited in view that a smaller interconnect in the thickness has a larger line resistance. As a result, parasitic capacitance between interconnects, especially in the same layer, tends to increase. For example, a current semiconductor device having a 0.35 $\mu$m design rule MOSFET has a line space between layers on the order of 1 $\mu$m, and has a line space between lines in the same layer on the order of 0.5 $\mu$m, which means that the parasitic capacitance between interconnects in the same layer is dominant compared to that between layers in the current semiconductor device. In a next generation semiconductor device, wherein a finer space will be achieved between interconnects in the same layer with the line thickness being maintained, it is likely that the most of the component of the parasitic capacitance is attributable from the adjacent interconnects in the same layer. In this case, the semiconductor device will not effectively function due to its lower operational speed.

Figure 1A:
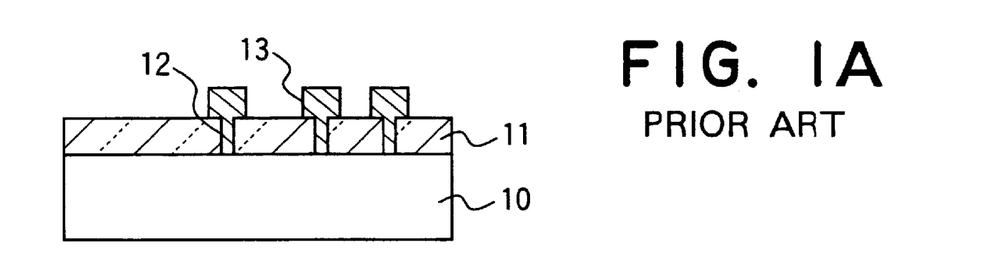
FIGS. 1A to 1C are cross-sectional views of a conventional semiconductor device in consecutive steps for fabrication thereof.
Figure 1B:
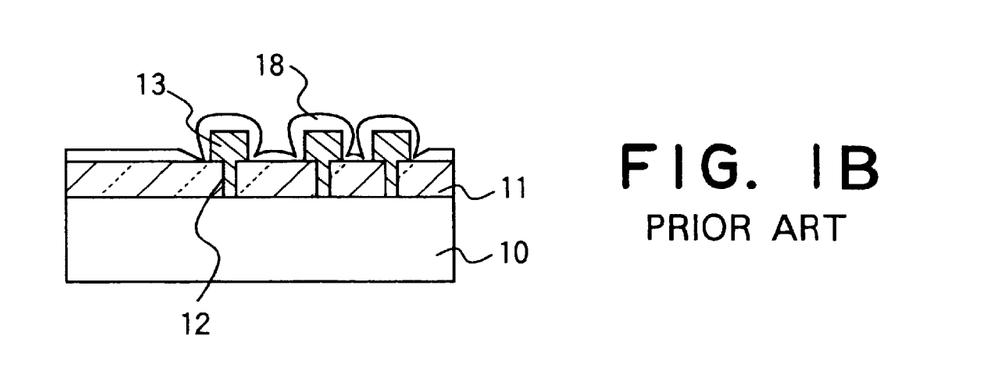
Figure 1C:
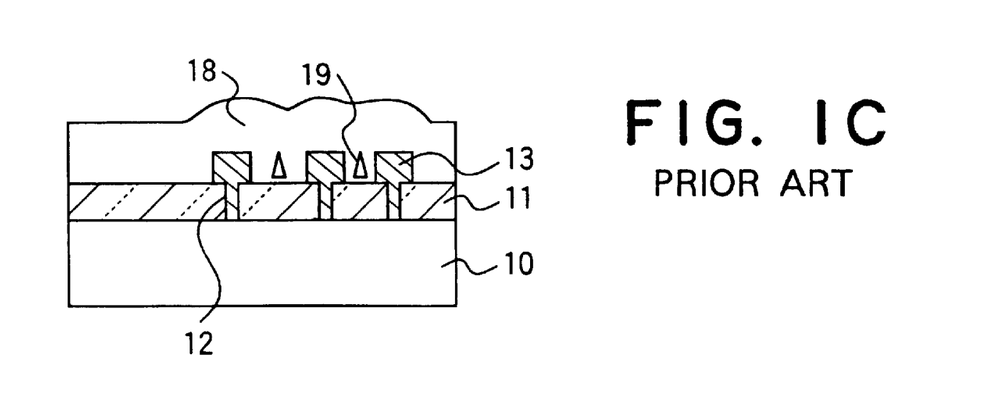

Patent Publication JP-A-7-326670 proposes a multilevel interconnection structure wherein an air void (air gap) is provided between adjacent lines in order to decrease the parasitic capacitance therebetween for improvement of the operational speed of the semiconductor device. Air has a lowest permittivity among known materials to thereby obtain a lower parasitic capacitance. FIGS. 1A to 1C show the process for fabrication of the multilevel interconnection structure having the air gap. In FIG. 1A, a first interlevel dielectric film 11 is formed on a semiconductor substrate 10, followed by formation of a first level interconnect layer 13 by using a selective etching technique. Next, as shown in FIG. 1B, a second interlevel dielectric film 18 made of silicon oxide exhibiting a poor deposition capability within through-holes is formed thereon by an atmospheric pressure CVD using monosilane and oxygen. The silicon oxide film 18 is grown to a large thickness, as shown in FIG. 1C, and involves an air void 19 within a small space between interconnects 13 due to the overhang of the silicon oxide film 18 itself. The resultant interconnects 13 have a smaller parasitic capacitance due to the air void 19.

Figure 2:
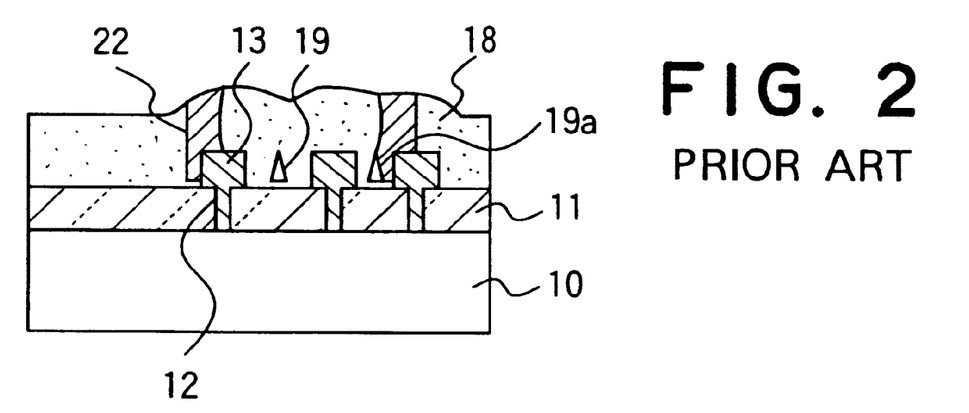
FIG. 2 is a cross-sectional view of the semiconductor device of FIGS. 1A to 1C in the case of a problem caused by misalignment during etching.

In the technique as described above, however, it is generally difficult to control the parasitic capacitance with reproducibility due to the uncontrollable geometry of the air voids 19 which depend on the geometry of the interconnects 13 and therefore involve variation of the shape and size. The uncontrollable parasitic capacitance retards the optimum design for the circuit structure. In addition, the reduction of the parasitic capacitance is not sufficient because the silicon oxide 18 remaining between interconnects 13 raises the parasitic capacitance. Further, as shown in FIG. 2, if a through-hole overlaps with an air void 19a due to misalignment during selective etching of the first interlayer dielectric film 18, the air void 19a is also filled with metallic plug 22, which rather raises the parasitic capacitance. That is, this technique is substantially limited to a top dielectric layer or to the case of a sufficient margin for the etching.

Patent Publication JP-A-7-245301 proposes, for solving the above problem, a technique wherein an interlayer dielectric film made of carbon is deposited by CVD, followed by removal thereof by ashing. By this technique, parasitic capacitance is remarkably reduced because only an air gap is disposed between interconnects for insulation. The problem through-hole as described above will not arise if the ashing is carried out after fabrication of the contact plugs.

In this technique, however, the interconnects are supported only by the junctions or connections of the interconnects because the dielectric film between layers are substantially entirely removed, which raises another problem wherein interconnects are deformed by the absence of the intermediate support therefor. The deformation may cause an increase of the parasitic capacitance or a short-circuit failure. In addition, the metallic interconnects suffer from an insufficient radiation of heat generated during operation of the semiconductor device, which may accelerate electromigration of the metallic film. Further, since there is little etch-selectivity between current photoresist materials and the carbon film, this technique is not suited for a multilevel interconnection structure, wherein a plurality of etching steps are iterated.

SUMMARY OF THE INVENTION

It is therefore an object of the present invention to provide a high-speed semiconductor device having a low parasitic capacitance without suffering from deformation of the interconnects or low thermal radiation.

It is another object of the present invention to provide a method for fabricating such a semiconductor device.

The present invention provides a semiconductor device comprising a semiconductor substrate, a first interlevel dielectric film overlying the semiconductor substrate, first metal interconnects formed on the first interlevel dielectric film and insulated from one another by a first air gap, a second interlevel dielectric film formed on the first level interconnects, and second metal interconnects formed on the second interlevel dielectric film and insulated from one another by a second air gap.

The present invention also provides a method for fabricating a semiconductor device comprising the steps of:

iterating a plurality of times the steps of forming a first interlevel dielectric film overlying a semiconductor substrate, and forming interconnects, disposed within a carbon film, on the first interlevel dielectric film, a top surface of the carbon film being substantially flush with a top surface of the interconnects;

forming a second interlevel dielectric film on top the interconnect and top the first carbon film;

forming a bore in the second interlevel dielectric film having a bottom reaching a top surface of one of the carbon films; and removing at least the one of carbon films through the bore to form an air gap between corresponding the interconnects.

The present invention provides another method for fabricating a semiconductor device comprising:

iterating a plurality of times the steps of forming a first interlevel dielectric film overlying a semiconductor substrate, forming interconnects on the interlevel dielectric film, selectively etching the first interlevel dielectric film by using the interconnects as a mask, embedding the interconnects with a carbon film having a top surface which is flush with a top surface of the interconnects;

forming a second interlevel dielectric film on top the interconnects and top the carbon film;

forming a bore in the second interlevel dielectric film having a bottom reaching a top surface of the top carbon film; and removing the carbon films through the bore to form an air gap between the interconnects.

In accordance the with semiconductor device of the present invention or the semiconductor devices formed by the methods of the present invention, the parasitic capacitance between the interconnects is reduced due to the insulation by the air gaps, without generating deformation or a short-circuit failure of the interconnects because the interconnects are insulated between layers by the interlevel dielectric films.

The above and other objects, features and advantages of the present invention will be more apparent from the following description, referring to the accompanying drawings.

BRIEF DESCRIPTION OF THE DRAWINGS

FIGS. 7A to 7I are cross-sectional views of a semiconductor device according to a fourth embodiment of the present invention in consecutive steps for fabrication thereof;

PREFERRED EMBODIMENTS OF THE INVENTION

Now, the present invention is more specifically described with reference to accompanying drawings, wherein similar constituent elements are designated by the same or similar reference numerals throughout the drawings.

Figure 3A:
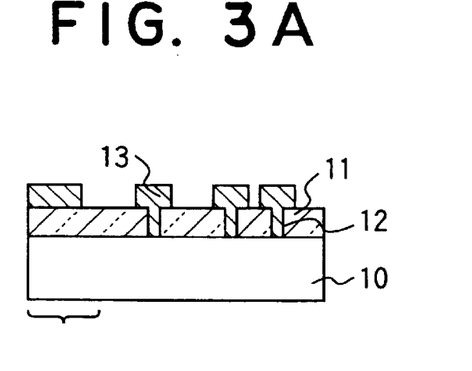
FIGS. 3A to 3I are cross-sectional views of a semiconductor device according to a first embodiment of the present invention in consecutive steps for fabrication thereof.

Referring to FIGS. 3A to 3I, there is shown a semiconductor device according to a first embodiment of the present invention in consecutive steps for fabrication thereof. In FIG. 3A, a first interlayer dielectric film 11 is deposited on a semiconductor (silicon) substrate 10 as by CVD, followed by chemical-mechanical polishing (CMP) thereof for planarization purpose and subsequent etching of the first interlevel dielectric film 11 for exposing diffused region of the semiconductor substrate 10. Thereafter, a metal is deposited and patterned for forming contact plugs 12 in ohmic contact with the semiconductor substrate 10 and first level interconnects 13 on the first interlevel dielectric film 11. For example, the first dielectric film 11 is made of silicon oxide and contact plugs 12 are made of CVD tungsten. In the etching of the CVD tungsten, it is important that the interconnects 13 are left on the top of the wafer in this step for later steps.

Figure 3B:
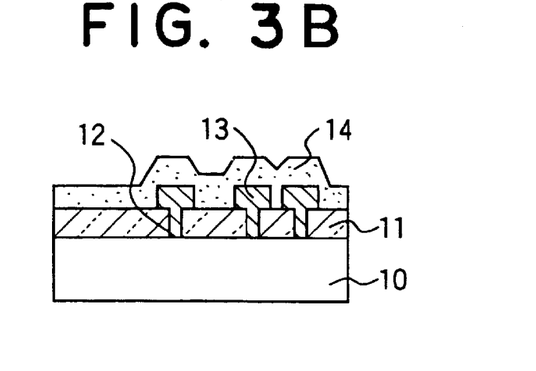
Figure 3C:
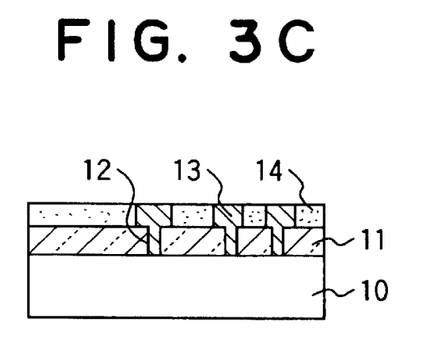

Subsequently, a carbon film 14 is deposited as by a CVD technique on the entire surface, filling the space between first level interconnects 13, as shown in FIG. 3B. The process conditions for the CVD may be such that described in Patent Publication JP-A-7-245301. Alternatively, an organic film may be formed as by a spin-coating technique, followed by carbonization thereof using ultraviolet ray irradiation. Then, as shown in FIG. 3C. the first carbon film 14 is subjected to a CMP step for removal thereof from the top surface of the first layer interconnects 13, leaving the carbon film 14 only in the space between the interconnects 13.

Figure 3D:
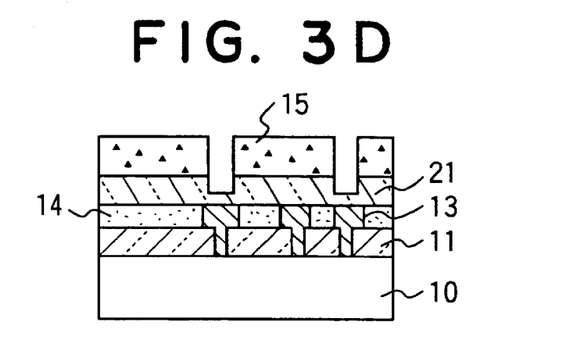

Subsequently, as shown in FIG. 3D, a second interlevel dielectric film 21 made of SiOF etc. is deposited as by CVD on the first carbon film 14 and the first level interconnects 13. SiOF is particularly effective in this case because of a lower permittivity thereof for obtaining a lower parasitic capacitance and a sufficient etch-selectivity between the same and carbon during etching of the first carbon film 14 as by using oxygen plasma or ozone. A plasma enhanced $SiO_2$ film may be used instead, if a thick second interlevel dielectric film is to be formed thereon for reduction of the parasitic capacitance between layers. Thereafter, the second interlevel dielectric film 21 is selectively etched by an under-etching technique at the locations for first via-holes or through-holes by using a photoresist mask 15 patterned by a photolithographic technique. After the under-etching, a thin portion of the second interlevel dielectric film 21 is left at the bottom of first through-holes covering the carbon film 14.

Figure 3E:
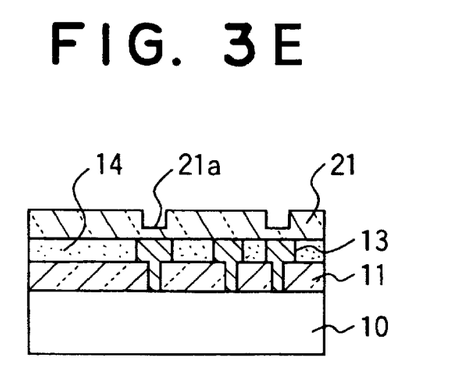

Subsequently, as shown in FIG. 3E, the photoresist mask 15 is removed as by oxygen plasma etching in the state wherein the first carbon film 14 is not exposed as a top layer of the wafer because of the. presence of the thin portion of the second interlayer dielectric film 21 on the first level interconnects 13 at the bottom of the first through-holes. This prevents undesirable side etch of the first carbon film 14 which exhibits a low etch-selectivity between the same and the photoresist mask 15 during the dry etching of the photoresist mask 15.

After the removal of the photoresist mask 15, a slight etch back of the second dielectric film 21 is conducted to entirely remove the thin portion of the second dielectric film 21 at the bottom of the first through-holes for exposing the top of the first level interconnects 13, followed by filling the first through-holes with tungsten or aluminum plugs.

Figure 3F:
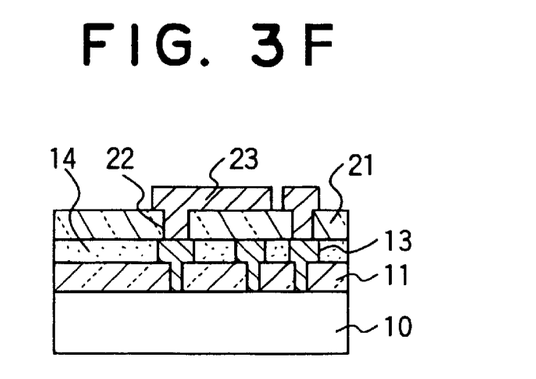
Figure 3G:
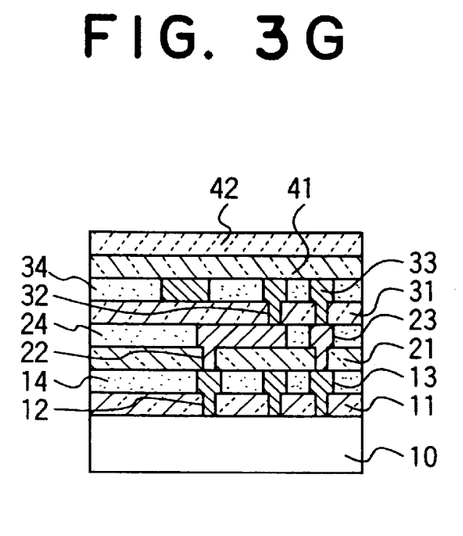

Subsequently, second level interconnects 23 are formed on the second interlevel dielectric film 21 and in the first through-holes, as shown in FIG. 3F. Thereafter, deposition and CMP of another carbon film 24, deposition of another interlevel dielectric film 31, selective etching of the another interlevel dielectric film 31 for formation of through-holes, and deposition and patterning of another level interconnects 33 are iterated to obtain the multi-level (three-level in this case) interconnection structure shown in FIG. 3G, wherein a fourth interlevel dielectric film 41 and a plasma-enhanced CVD SiN film 42 are overlaid on the top interconnects 33 and the top carbon film 34.

Figure 3H:
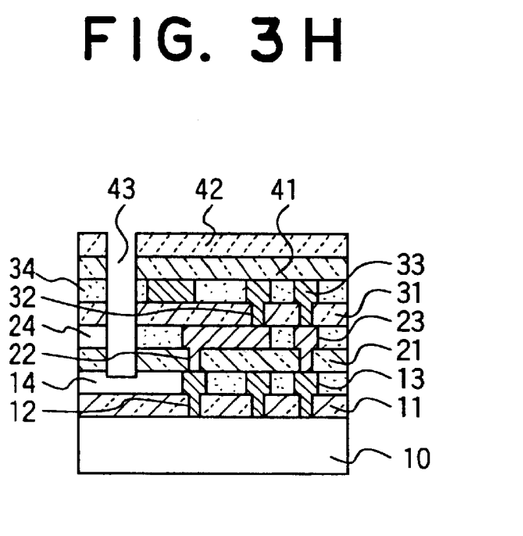

A bore 43 is then formed by a photolithographic and etching technique at a location that does not align with any underlying interconnects 13, 23 and 33, as shown in FIG. 3H. The bore 43 is formed by the steps of anisotropic etching the plasma-enhanced CVD SiN film 42 by using a photoresist mask not shown, removing the photoresist mask, anisotropic etching the fourth interlevel dielectric film 41 by using the plasma-enhanced CVD SiN film 42 as a mask, and consecutively anisotropic-etching the third carbon film 34, the third interlevel dielectric film 31, the second carbon film 24, the second interlevel dielectric film 21 by using the adjacent overlying layer as a mask. The bore 43 has a bottom reaching the first carbon film 14 and is used in the next step for entirely removing the carbon films 34, 24 and 14.

The etch-selectivity between the photoresist and carbon films 34 and 24 is not sufficient for an ordinary anisotropic etching. If it is desired that a photoresist film formed directly on the fourth interlevel dielectric film 41 be used as a mask for etching the fourth interlevel dielectric film 41 to form the bore 43 without disposing therebetween the plasma-enhanced CVD SiN film 42, an ordinary thickness of 1 to 2 $\mu$m for the photoresist film is not sufficient for protecting the fourth interlevel dielectric film 41 because the photoresist film will be entirely removed after the etching for two or three layers of the carbon films. In this respect, the plasma-enhanced CVD SiN film 42 is provided as a top layer on the fourth interlevel dielectric film 41 in the present embodiment, having a large etchs-electivity between the same and the interlevel dielectric film or the carbon film.

If a photoresist pattern is to be used as a mask instead of the plasma-enhanced CVD NiF film 42, the thickness Tx of the photoresist mask should be as follows:

$Tx > T2 + T3 + \ldots + Tn$

Wherein Ti (i=2, 3 ..., n) represents the thickness of the i-th film counted from the bottom. In the above formula, T1 is not included because the bottom carbon film 14 need not be etched during formation of the bore 43. The upper limit of the thickness of the photoresist is determined at a value by which the lower limit of the size of the through-hole can be defined with a sufficient resolution.

Figure 4:
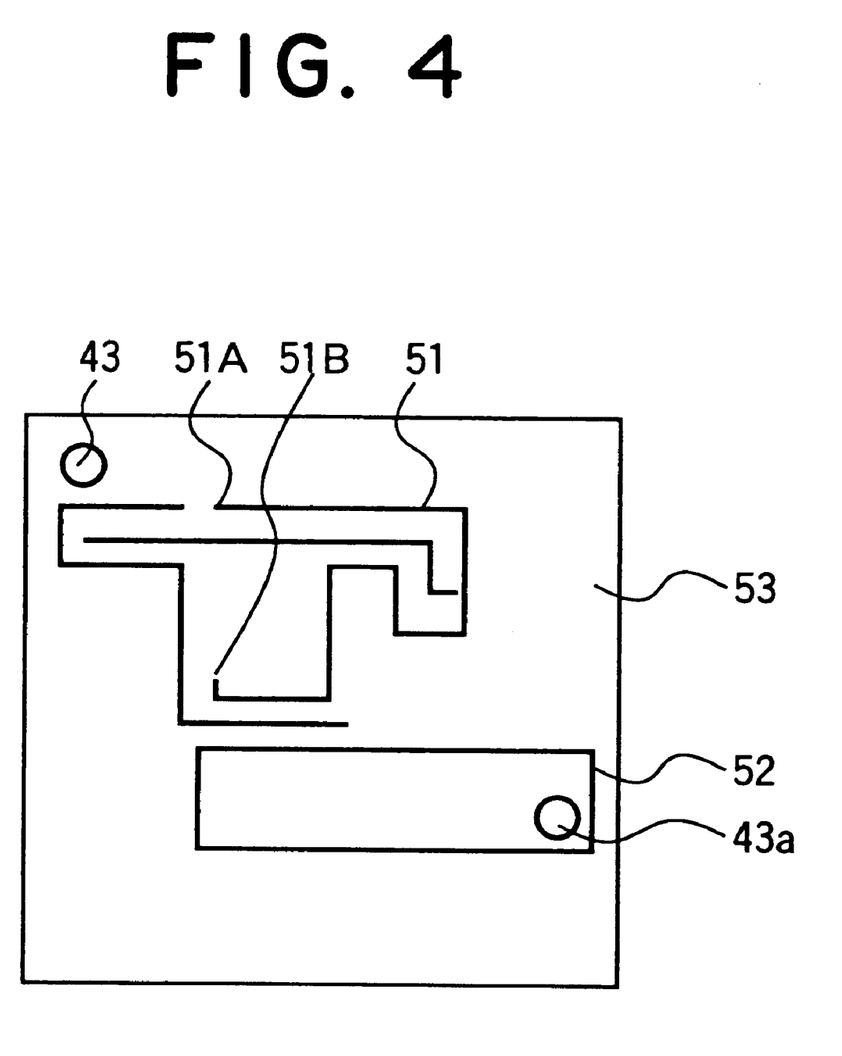
FIG. 4 is a top plan view of a semiconductor device for showing the location of bores for removal of the carbon film.

The number of the bores 43 may be one or more for a chip in the present embodiment. Although a plurality of bores 43 may be desired in order to raise the through-put for the carbon film removal, a single bore 43 is generally sufficient in a chip. Referring to FIG. 4, there is shown a schematic top plan view of interconnects in one level of a multi-level interconnection structure in a semiconductor chip, wherein two bores 43 and 43a for use in carbon film removal are shown. In this example, two interconnects 51 and 52 are formed within a carbon film 53, interconnect 51 having open ends 51A and 51B, interconnect 52 being closed. The closed structure of interconnect 52 requests an independent bore 43a for removal of a closed portion of the carbon film 53, whereas the open ends 51A and 51B of interconnect 51 enable the common single bore 43 in a chip to remove carbon film 53. The closed structure of an interconnect such as interconnect 52, however, is not practical in an ordinary semiconductor chip, and a single bore 43 is generally sufficient for the entire chip.

Figure 3I:
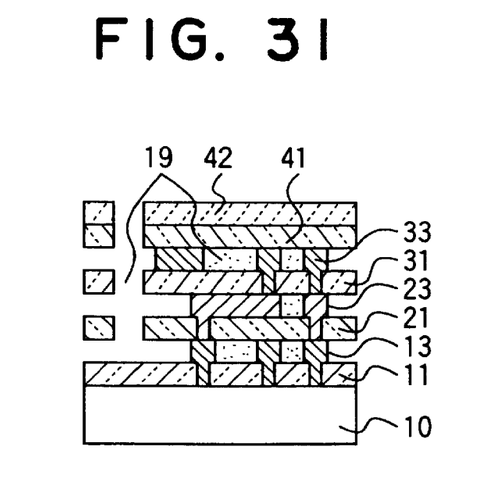

After the bore 43 is formed in FIG. 3H, isotropic etching of the carbon films is conducted by exposing the carbon films 14, 24, 34 to oxygen plasma or hydrogen plasma without a substrate bias voltage, thereby removing the carbon films, as shown in FIG. 3I. In this step, all the carbon films 34, 24 and 14 between the interconnects 33, 23 and 13 are removed by ashing effected by oxygen free radicals or hydrogen free radicals, resulting in a specific geometry of a multilevel interconnect structure wherein the interconnects 13, 23 and 33 are insulated from one another by air gaps 19 in the same layer and by interlevel dielectric films 11, 21 and 31 between layers and from the semiconductor substrate 10. In this structure, the interconnects 13, 23 and 33 are supported by respective underlying films 11, 21 and 31, which fact does not cause a deformation in the interconnects 13, 23 and 33 or a short-circuit failure therein, whereby a reliable interconnection structure can be obtained.

In an alternative of the process, the carbon films 14, 24 and 34 may be removed by exposing the same to an ozone ambient, wherein ultraviolet rays are irradiated for assisting cut of carbon bonds in the carbon films to raise the oxidizing efficiency by the ozone and for assisting regeneration of ozone from oxygen ($O_2$) which is generated by decomposition of ozone, whereby the carbon films can removed efficiently.

In another alternative of the process, the removal of the carbon films may be conducted by an etching gas such as nitrogen oxide, or by oxidation in an oxygen-ambient at a high temperature. The latter process may involve undesirable thermal melt down of metallic lines, which can be prevented by dividing the process into two combustion steps: the first step is effected for removal of the main portion of the carbon films in a low oxygen concentration which may be obtained by diluting oxygen gas with an inert gas such as argon or nitrogen for lowering the calorific power of the combustion to suppress an excess burning; and the second step is effected in a high oxygen concentration for removing the remaining carbon in a narrow space, such as between the interconnects, in an accelerated combustion. The two methods as described above may be combined together, wherein the carbon films are removed in an ozone ambient at a high temperature, for example.

The removal of the carbon films may be conducted after a bonding operation for mounting the semiconductor device onto a circuit board etc., because the presence of the air gap may involve destruction of the interconnects during the bonding. The removal of the carbon films may be preferably conducted in a dry air ambient for avoiding corrosion of metallic interconnects by moist air introduced in the air gap formed by the removal of the carbon films. The dry air may be replaced by an inert gas such as nitrogen, neon, helium and argon.

Figure 5A:
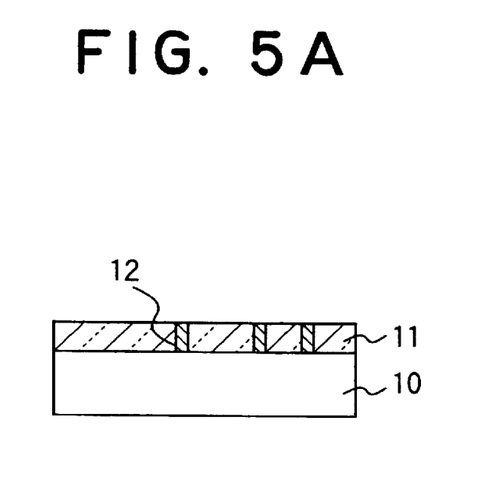
FIGS. 5A to 5G are cross-sectional views of a semiconductor device according to a second embodiment of the present invention in consecutive steps for fabrication thereof.

Referring to FIGS. 5A to 5G, there are shown fabrication steps of a semiconductor device according to a second embodiment of the present invention. In FIG. 5A, a first interlevel dielectric film 11 is deposited on a semiconductor substrate 10 as by CVD, followed by CMP thereof for planarization and subsequent forming contact plugs 12 on diffused regions in the semiconductor substrate 10, which steps are well known in the art.

Figure 5B:
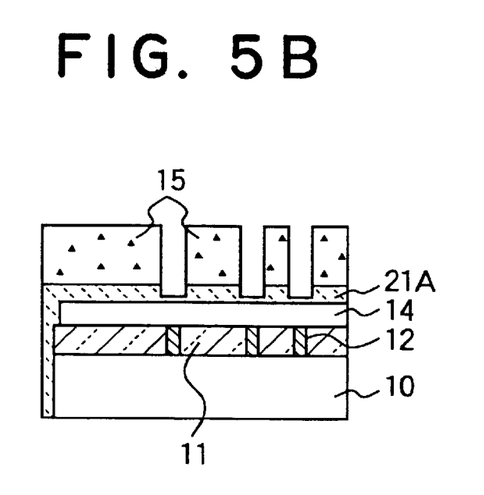

Subsequently, a first carbon film 14 and a first mask film 21A made of SiOF are consecutively deposited by CVD, followed by formation of a photoresist mask 15 having a negative pattern of interconnects. The SiOF mask film 21A is then selectively etched by under-etching using the photoresist film 15 as a mask. In this step, the surface of the carbon film 14 is not exposed, as shown in FIG. 5B.

Figure 5C:
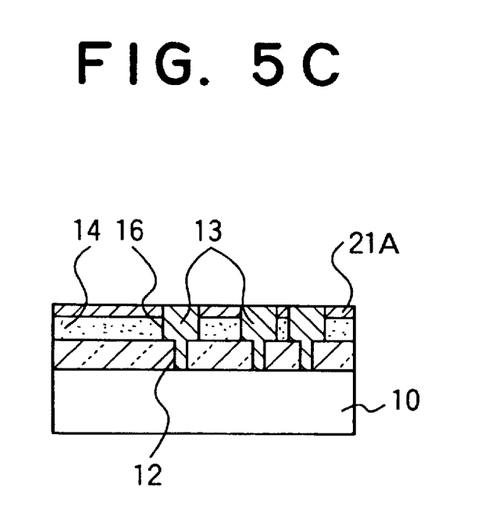

Subsequently, the photoresist mask 15 is removed, followed by slight etch-back of the entire first mask film 21A for exposing portions of the first carbon film 14, which have a negative pattern of interconnects. The first carbon film 14 is then etched by anisotropic etching using the first mask film 21A as a mask to form the interconnect pattern in the form of open trenches 16. A metal such as aluminum or copper is then deposited on the entire surface including the open trenches 16, followed by CMP to remove the metal on top of the carbon film and leave the metal only in the trenches 16, thereby forming first level interconnects 13 disposed in the trenches 16. In this process, the carbon film 14 is etched by using the SiOF film 21A as a mask, not by using the photoresist film 15 as a mask. This is because the etch-selectivity between the carbon and photoresist is not sufficient for effecting a suitable selective etching. In addition, the under-etch of the SiOF film 21A is conducted in the process for avoiding the removal of the carbon film 14 during etching of the photoresist film 15.

Figure 5D:
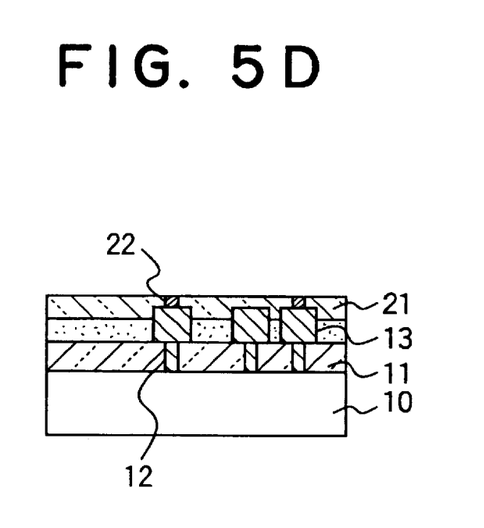
Figure 5E:
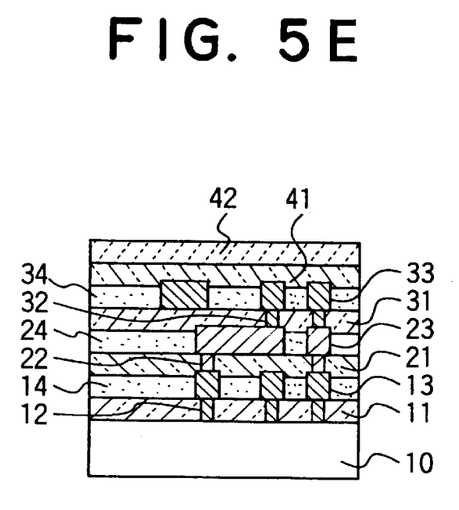
Figure 5F:
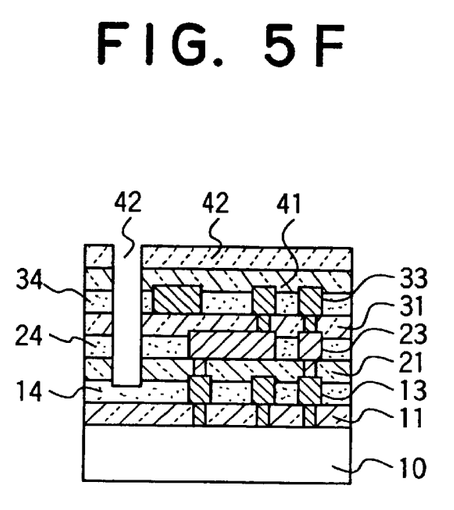
Figure 5G:
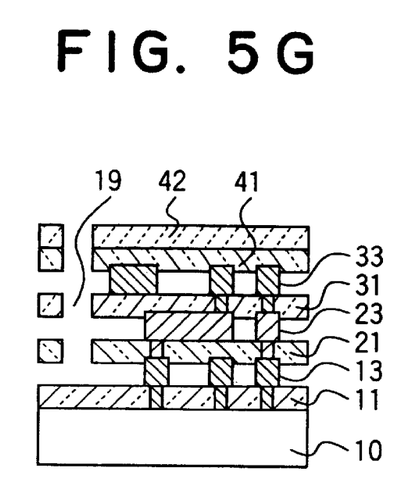

Subsequently, a second interlevel dielectric film 21 made of SiOF is formed on the carbon film 14 and the first level interconnect 13, followed by selective etching to form through-holes 22 in the second interlevel dielectric 21 as shown in FIG. 5D, similarly to the case of the first interlevel dielectric 11. The combination of deposition of carbon film 24, deposition of oxide film 31, deposition and CMP of metal is iterated a plurality of times to obtain a multilevel interconnection structure. FIG. 5E shows an exemplified three-level interconnection structure formed by the present embodiment, wherein a fourth interlevel dielectric film 41 and plasma-enhanced CVD SiN film 42 are consecutively deposited on the top interconnects 33. Thereafter, a bore 43 for removing the carbon films is formed by etching to reach the first carbon film 14, as shown in FIG. 5F. The bore 43 is formed at a horizontal location wherein any level interconnects 13, 23 and 33 do not appear in the bore 43. The bore 43 is then used for removal of the carbon films 34, 24 and 14, similarly to the first embodiment, as shown in FIG. 5G.

In the second embodiment, the CMP technique is applied to the metal interconnect layers, not to the carbon films. That is, conventional and well-known CMP techniques generally applied to metallic films can be used in the present embodiment, which makes the present embodiment more advantageous over the first embodiment.

Figure 6A:
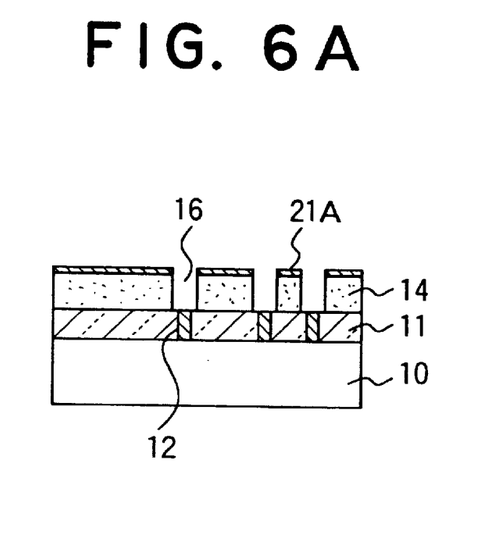
FIGS. 6A to 6G are cross-sectional views of a semiconductor device according to a third embodiment of the present invention in consecutive steps for fabrication thereof.
Figure 6B:
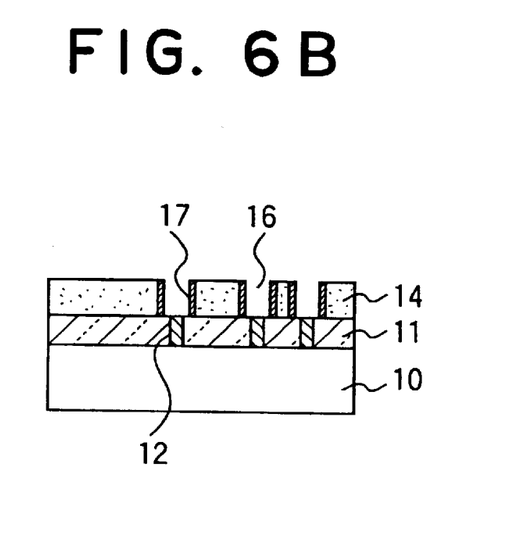
Figure 6C:
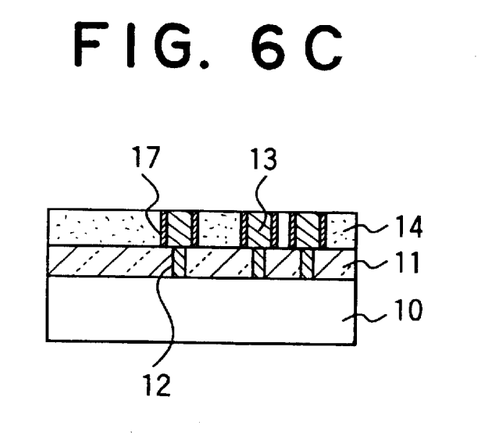

Referring to FIGS. 6A to 6G, there are shown fabrication steps of a semiconductor device according to a third embodiment of the present invention. In FIG. 6A, first interlevel dielectric film 11, contact plugs 12, first carbon film 14 and SiOF mask pattern 21A are formed overlying the semiconductor substrate 10, and the first carbon film 14 is selectively etched using the SiOF mask pattern 21A as a mask, similarly to the second embodiment, to form an interconnect pattern in the form of trenches 16 in the first carbon film 14. Then, another SiOF film not shown, which generally has a low permittivity, is formed on the entire surface, followed by etch-back thereof to leave the same as a side wall film 17 on the side walls of the trenches 16, as shown in FIG. 6B.

Figure 6D:
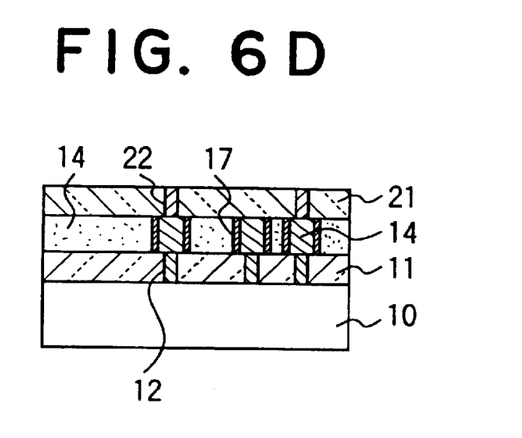
Figure 6E:
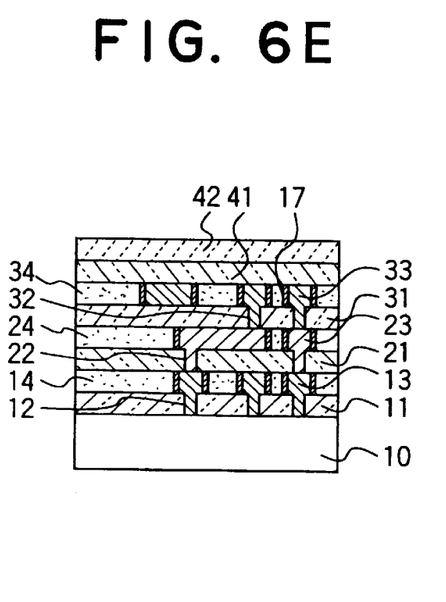
Figure 6F:
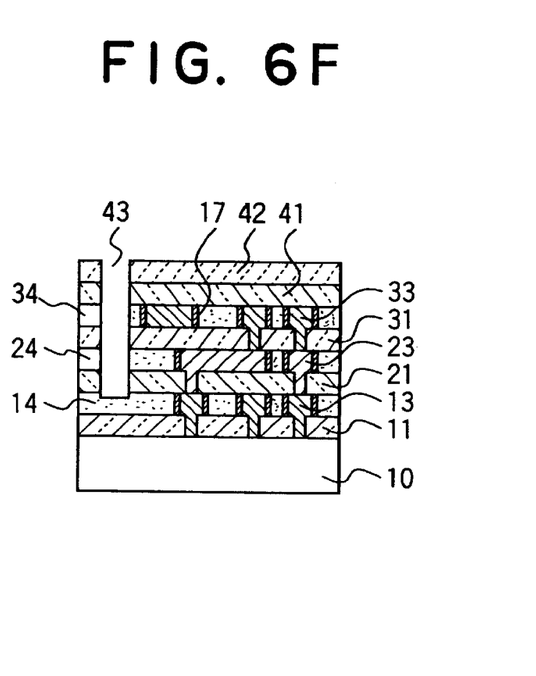
Figure 6G:
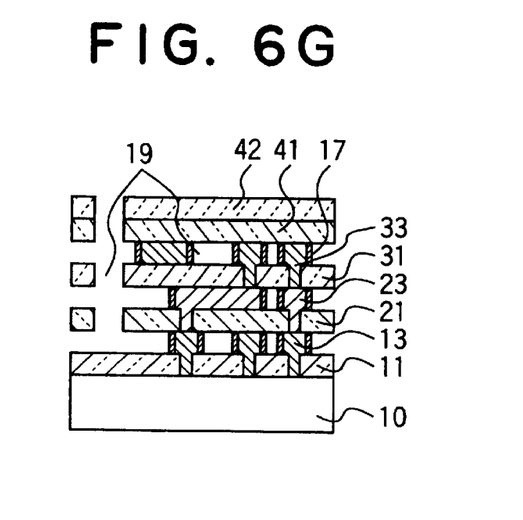

Subsequently, metal such as aluminum or copper is deposited on the entire surface, followed by CMP to remove the metal on top of the first carbon film 14 to leave interconnects 13 in the trenches 16. A second interlevel dielectric film 21 is then deposited and patterned to form through-holes 22, as shown in FIG. 6D. The combination of carbon deposition, formation of interconnect pattern and an interlevel dielectric film is iterated to form a multilevel interconnection stricture, as shown in FIG. 6E. Then a bore 43 is formed, as shown in FIG. 6F, and carbon films 34, 24 and 14 are removed through the bore 43, similarly to the first through third embodiments, as shown in FIG. 6G. The side-wall film 17, formed on the side walls of the trenches 16 in the present embodiment, slightly increases the parasitic capacitance of the interconnects 13, 23 and 33, and protects the interconnects against ingress of moisture. As a result, the present embodiment achieves advantages of prevention of a short-circuit failure and corrosion of the metal interconnects to improve the reliability of the semiconductor device.

Figure 7A:
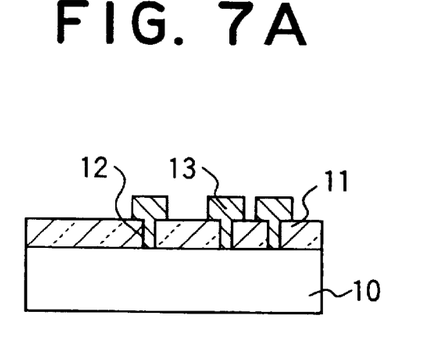
Figure 7B:
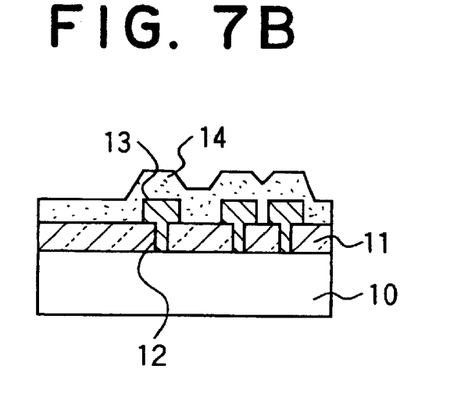
Figure 7C:
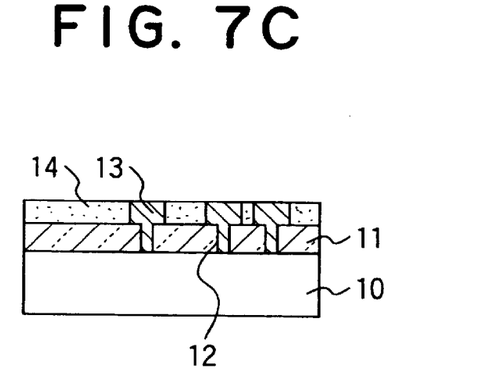
Figure 7E:
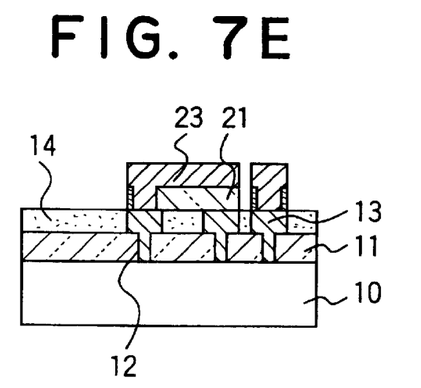

Referring to FIGS. 7A to 7I, there are shown fabrication steps of a semiconductor device according to a fourth embodiment of the present invention. The steps up to the step shown in FIG. 7C are similar to those in the first embodiment, shown in FIGS. 3A to 3C. Then, a second interlevel dielectric film 21 made of silicon oxide and having through-holes therein is formed on the first level interconnects 13 and the first carbon film 13, followed by formation of a second level interconnects 23 thereon, as shown in FIG. 7D. The second interlevel dielectric film 21 is then selectively etched using the second level interconnects 23 as a mask to expose the underlying first carbon film 14, as shown in FIG. 7E. The silicon oxide used for the second interlevel dielectric film 21 is etched by a reactive ion etching (RIE) technique using a mixture of $CH_4$ and $H_2$ as an etching gas and metallic film as a mask, which is known in the art. In an alternative, the second interlevel dielectric 21 film may be etched using a photoresist mask as used for patterning the second level interconnects 23.

Figure 7F:
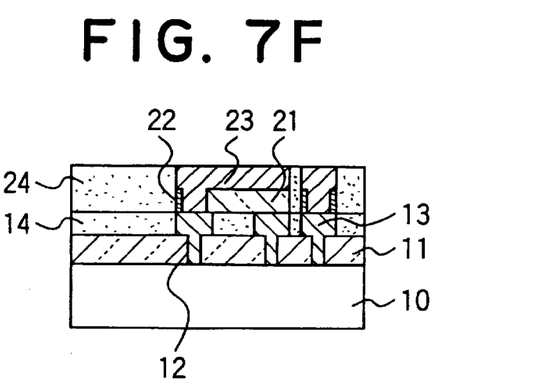
Figure 7G:
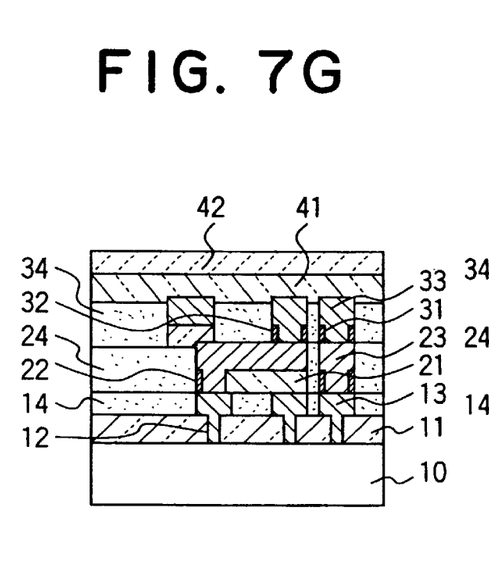

Subsequently, a second carbon film 24 is deposited as by CVD on the entire surface to cover the second level interconnects 23 and the first carbon film 14, followed by CMP thereof for planarization of the surface to obtain a structure wherein the top of the carbon film 24 is flush with the top of the second level interconnects 23, as shown in FIG. 7F. The combination of deposition and patterning of interlevel dielectric film, formation of interconnects, and deposition and CMP of carbon film is iterated to obtain a multi-level interconnection structure, as shown in FIG. 7G, wherein a fourth interlevel dielectric film 41 and a plasma-enhanced CVD SiN film 42 are formed on the top interconnects 33 and the top carbon film 34.

Figure 7H:
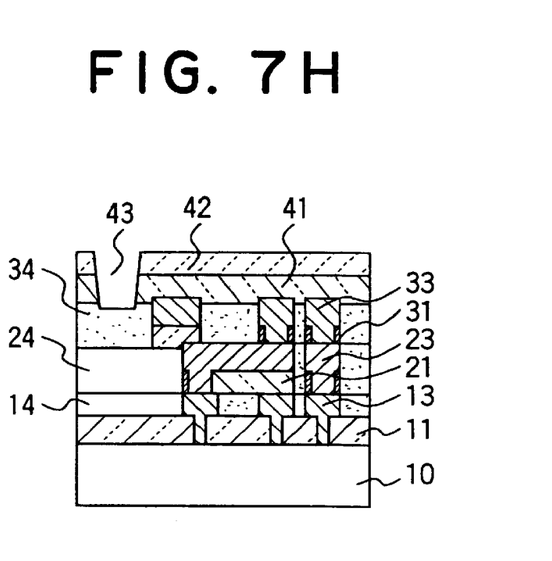
Figure 7I:
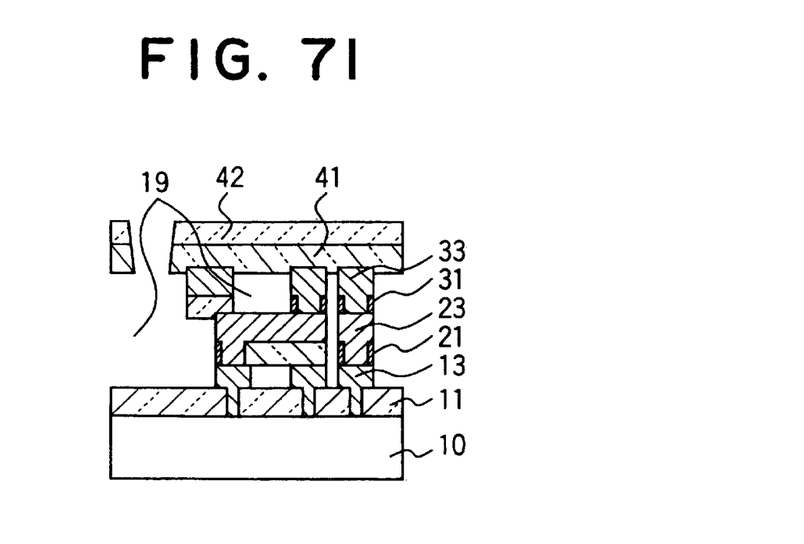

Thereafter, a bore 43 is formed having a bottom reaching the surface of the top carbon film 34 by using a photolithographic technique and an anisotropic etching technique, as shown in FIG. 7H. Then, the carbon films 34, 24 and 14 are etched through the bore 43 to obtain an air-gap/multi-level interconnection structure wherein interconnects 13, 23 and 33 are insulated from one another in the same layer by an air gap 19 and insulated by the interlevel dielectric films 11, 21, 31 and 41 between layers and from the substrate 10. In the present embodiment, each of the carbon films 34, 24 and 14 is disposed in direct contact with adjacent overlying carbon film so that the bore 43 having a bottom at the surface of the top carbon film 34 is sufficient for etching all the carbon films 34, 24 and 14. By this configuration, if a closed interconnect 52 shown in FIG. 4 is disposed in a carbon film, another bore such as the bore 43a is not needed in the present embodiment.

Figure 8:
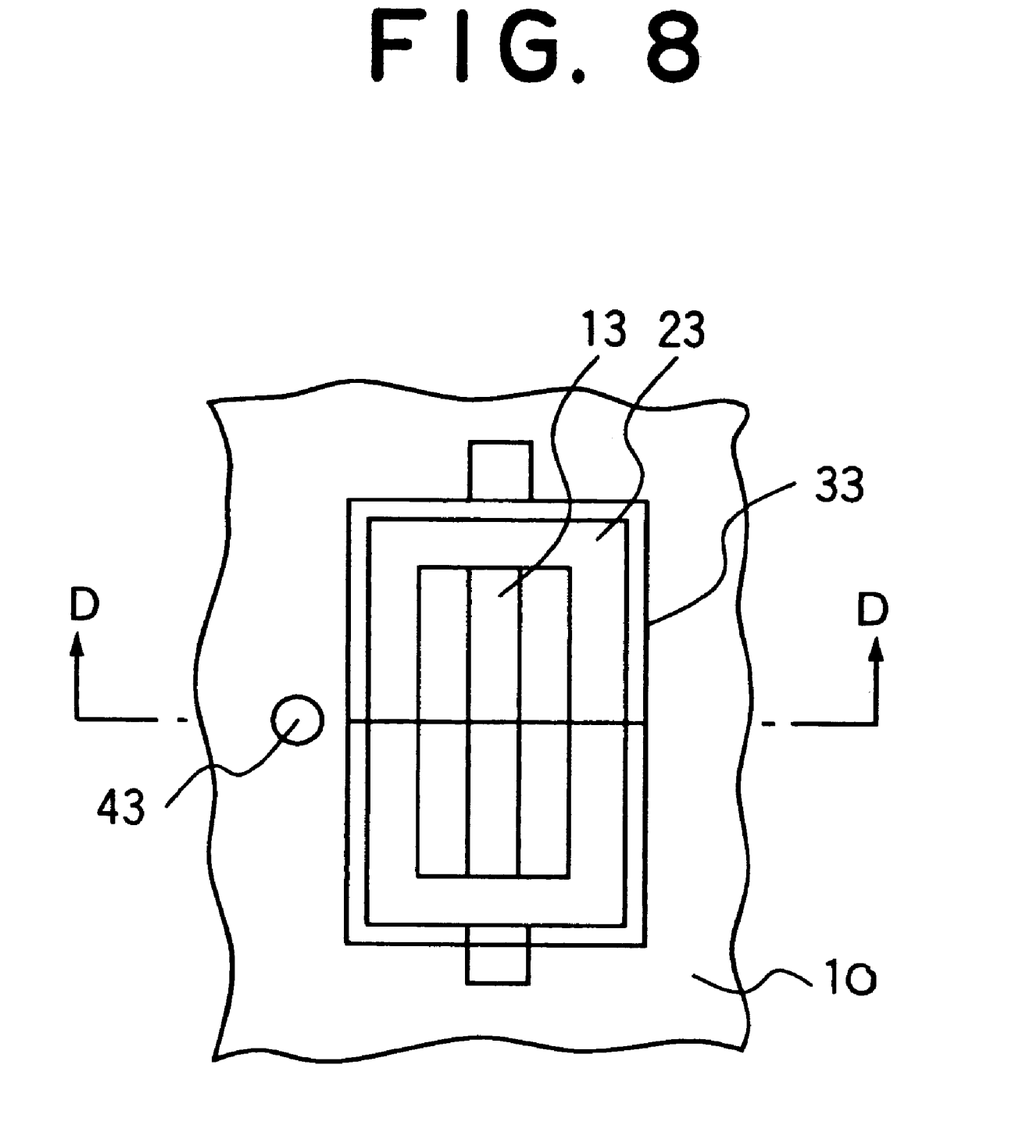
FIG. 8 is a top plan view of the semiconductor device according to the fourth embodiment for showing interconnects and bore hole removal of the carbon film.

FIG. 8 shows interconnects 13, 23 and 33 in a perspective view of a specific example of interconnects in a semiconductor device according to the fourth embodiment as viewed from the top thereof. FIGS. 9A to 9E are cross-sectional view of the semiconductor device of FIG. 8, taken along line D—D in FIG. 8 for showing the steps in the removal of the carbon films. These drawings are shown for describing the function of the bore 43 in FIGS. 7H and 7I during removing the entire carbon films even with the case of the presence of a closed interconnect 23 such as interconnect 52 in FIG. 4.

Figure 9A:
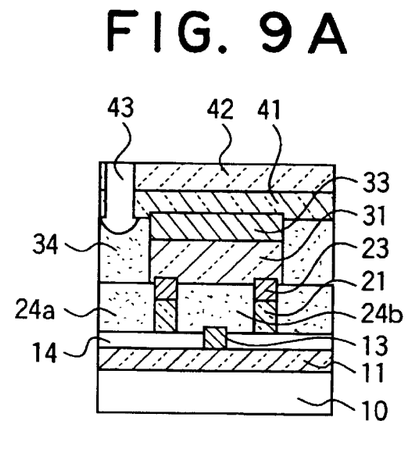
FIGS. 9A to 9E are cross-sectional views of the fourth embodiment taken along lines D—D in FIG. 8 in consecutive steps for removal of carbon films.
Figure 9B:
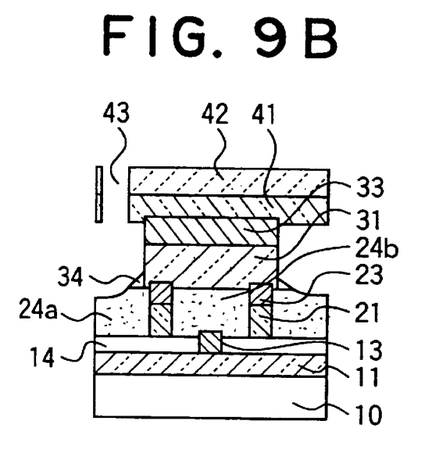
Figure 9C:
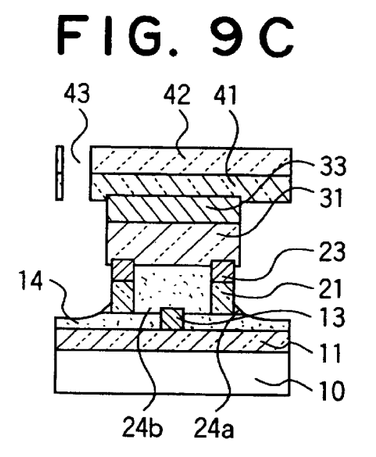
Figure 9D:
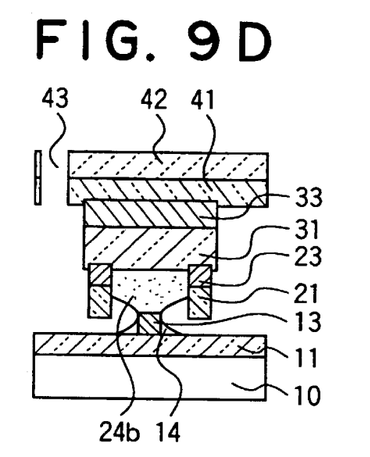
Figure 9E:
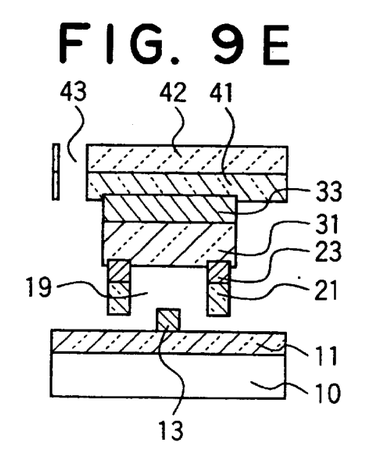

The removal of the carbon films 14, 24 and 34 first proceeds with the top carbon film 34 at the bottom of the bore 43 as shown in FIG. 9A to eventually expose the second carbon film 24, then proceeds with a portion 24a of the second carbon film 24, as shown in FIG. 9B, other than the portion 24b encircled by the closed interconnect 23. The removal then proceeds with the exposed first carbon film 14, as shown in FIG. 9C, to expose the bottom of the portion 24b of the second carbon film 24 encircled by the closed interconnect 23, as shown in FIG. 9D. Finally, the portion 24b of the second carbon film 24 is removed from the bottom thereof, thereby obtaining the structure shown in FIG. 9E wherein entire carbon films are removed from the single bore 43.

In the present embodiment, a single bore is sufficient even in the case of the presence of a closed interconnect, and the interconnects 13, 23 and 33 are supported by respective underlying interlevel dielectric films 11, 21 and 31. Each of the interlevel dielectric films is preferably made of silicon oxide which may be added with fluorine.

Since the above embodiments are described only for examples, the present invention is not limited to the above embodiments and various modifications or alterations can be easily made therefrom by those skilled in the art without departing from the scope of the present invention.

What is claimed is:

1. A semiconductor device comprising a semiconductor substrate, a first dielectric film overlying said semiconductor substrate, first metal interconnects having a top portion and a bottom portion, wherein said top portion is disposed on a top surface of said first dielectric film and said bottom portion extends through said first dielectric film to contact said semiconductor substrate, a first air gap occupying substantially all of a space between said first dielectric film and a second dielectric film formed on said top portion of said first metal interconnects, except in a space occupied by said first metal interconnects, second metal interconnects having a top portion and a bottom portion, wherein said top portion is disposed on a top surface of said second dielectric film and said bottom portion of said second metal interconnects extends through said second dielectric film to contact said top portion of said first metal interconnects, said first air gap communicating with a second air gap, said second air gap occupying substantially all of a space between said second dielectric film and a third dielectric film formed on said top portion of said second metal interconnects, except in a space occupied by said second metal interconnects, between said second dielectric film and a third dielectric film formed on said top portion of said second metal interconnects, said semiconductor device further comprising a side-wall film covering side surfaces of each of said top portion of at least one of said first metal interconnects and said second metal interconnects.

2. A semiconductor device as defined in claim 1, further comprising at least a fourth dielectric film layer formed on a top portion of third metal interconnects, said third metal interconnects having said top portion and a bottom portion, wherein said top portion is disposed on a top surface of said third dielectric film and said bottom portion extends through said third dielectric film to contact said top portion of said second metal elements, and a third air gap occupying substantially all of a space, except in the locations of said third metal interconnects, between said third dielectric film and said fourth dielectric film.

3. A semiconductor device as defined in claim 1, wherein each of said dielectric films comprises a SiOF compound.

4. A semiconductor device as defined in claim 1, wherein each of said dielectric films comprises silicon dioxide.

5. A semiconductor device comprising:
a semiconductor substrate;
a first dielectric film overlying said semiconductor substrate, said first dielectric film having an upper surface and a lower surface, wherein said lower surface of said first dielectric film contacts said semiconductor substrate;
a plurality of openings in said first dielectric film;
a first plurality of conductive elements occupying said plurality of openings in said first dielectric film, said first plurality of conductive elements contacting said semiconductor substrate and extending through said upper surface of said first dielectric film, at least some of said first plurality of conductive elements having a portion that extends above said upper surface of said first dielectric film;
a second dielectric film, said second dielectric film having an upper surface and a lower surface, wherein said lower surface of said second dielectric film contacts said portion that extends above said upper surface of said first dielectric film;
a first space occupying substantially all of a space between said portion that extends above said upper surface of said first dielectric film, said upper surface of said first dielectric film, and said lower surface of said second dielectric film;
a plurality of openings in said second dielectric film;
a second plurality of conductive elements occupying said plurality of openings in said second dielectric film, said second plurality of conductive elements contacting at least some of said first plurality of conductive elements and extending through said upper surface of said second dielectric film, at least some of said second plurality of conductive elements having a portion that extends above said upper surface of said second dielectric film;
a third dielectric film, said third dielectric film having an upper surface and a lower surface, wherein said lower surface of said third dielectric film contacts said portion that extends above said upper surface of said second dielectric film; and
a second space occupying substantially all of a space between said portion that extends above said upper surface of said second dielectric film, said upper surface of said second dielectric film, and said lower surface of said third dielectric film,
wherein said first space is in communication with said second space,
said semiconductor device further comprises a side-wall film covering a side surface of one of said first conductive elements and said second conductive elements.

6. A semiconductor device as defined in claim 5, further comprising:
a plurality of openings in said third dielectric film;
a third plurality of conductive elements occupying said plurality of openings in said third dielectric film, said third plurality of conductive elements contacting at least some of said second plurality of conductive elements and extending through said upper surface of said third dielectric film, at least some of said third plurality of conductive elements having a portion that extends above said upper surface of said third dielectric film;
a fourth dielectric film, said fourth dielectric film having an upper surface and a lower surface, wherein said lower surface of said fourth dielectric film contacts said portion that extends above said upper surface of said third dielectric film; and a third space occupying substantially all of a space between said third plurality of conductive elements, said upper surface of said third dielectric film, and said lower surface of said fourth dielectric film.

7. A semiconductor device as defined claim 6, wherein said third space is occupied by air.

8. A semiconductor device as defined claim 6, wherein said fourth dielectric film is covered by a protective layer.

9. A semiconductor device as defined in claim 8, wherein said protective layer is a SiN film.

10. A semiconductor device as defined in claim 6, wherein each of said dielectric films comprises a SiOF compound.

11. A semiconductor device as defined in claim 6, wherein each of said dielectric films comprises a silicon oxide compound.

12. A semiconductor device as defined claim 5, wherein said first space and said second space are occupied by air.

13. A semiconductor device as defined in claim 5, wherein said third dielectric film is covered by a protective layer.

14. A semiconductor device as defined in claim 13, wherein said protective layer is a SiN film.

15. A semiconductor device as defined in claim 5, wherein each of said dielectric films comprises a SiOF compound.

16. A semiconductor device as defined in claim 5 wherein each of said dielectric films comprises a silicon oxide compound.

* * * * *